United States Patent [19]
Wiesler et al.

[11] Patent Number: 5,615,988
[45] Date of Patent: Apr. 1, 1997

[54] WAFER TRANSFER SYSTEM HAVING ROTATIONAL CAPABILITY

[75] Inventors: Mordechai Wiesler, Lexington, Mass.; Mitchell Weiss, Haverford, Pa.

[73] Assignee: PRI Automation, Inc., Billerica, Mass.

[21] Appl. No.: 651,715

[22] Filed: May 22, 1996

Related U.S. Application Data

[60] Provisional application No. 60/000963 Jul. 7, 1995.

[51] Int. Cl.$^6$ .................................................. B65G 1/06
[52] U.S. Cl. .......................... 414/416; 414/937; 414/938; 414/786
[58] Field of Search ................................. 414/416, 786, 414/937–939, 935, 217, 222

[56] References Cited

U.S. PATENT DOCUMENTS

| | | | |
|---|---|---|---|
| 4,427,332 | 1/1984 | Manriguez | 414/937 X |
| 4,775,281 | 10/1988 | Prentakis | 414/416 |
| 4,778,331 | 10/1988 | Kimata et al. | 414/937 X |
| 4,900,212 | 2/1990 | Mikahara | 414/416 |
| 5,026,239 | 6/1991 | Chiba et al. | 414/217 |
| 5,030,056 | 7/1991 | Kitayama et al. | 414/749 |
| 5,061,144 | 10/1991 | Akimoto et al. | 414/225 |
| 5,183,370 | 2/1993 | Cruz | 414/937 X |
| 5,382,128 | 1/1995 | Takahashi et al. | 414/937 X |
| 5,387,067 | 2/1995 | Grunes | 414/217 |
| 5,409,348 | 4/1995 | Suzuki | 414/786 |
| 5,443,346 | 8/1995 | Murata et al. | 414/222 |
| 5,460,478 | 10/1995 | Akimoto et al. | 414/786 |
| 5,464,313 | 11/1995 | Ohsawa | 414/172 |

FOREIGN PATENT DOCUMENTS

| | | |
|---|---|---|
| 63-181441 | 7/1988 | Japan . |
| 2276261 | 11/1990 | Japan . |
| 4106952 | 4/1992 | Japan . |
| 87507 | 3/1994 | Japan .................................. 414/937 |

*Primary Examiner*—David A. Bucci
*Attorney, Agent, or Firm*—Weingarten, Schurgin, Gagnebin & Hayes LLP

[57] ABSTRACT

A wafer transfer system is operable with a front or side loading wafer carrier to move one or more horizontally oriented wafers out of the carrier and to rotate the wafers to a vertical orientation in which the wafers are accessible for further processing. The transfer system provides a wafer extractor which employs a plurality of paired fingers of a size and configuration to fit between the spaced, stacked wafers in the carrier for lifting the wafers off the shoulders of the carrier. The fingers are then movable generally horizontally to remove the wafers from the carrier into two angled combs having ledges for receiving wafers. The fingers and combs are rotated to a vertical orientation in which the wafers are supported along their edges by the combs. The fingers are shifted horizontally a small amount relative to the combs to disengage from the wafers, either by a translation following the rotation or by rotating the fingers and combs about different axes. In this manner, the wafers are in a position from which they can be accessed by a robot arm according to the particular process. In a further embodiment, the fingers and combs are also translated forward during the rotation, thereby minimizing the floor space or footprint required by the system.

26 Claims, 11 Drawing Sheets

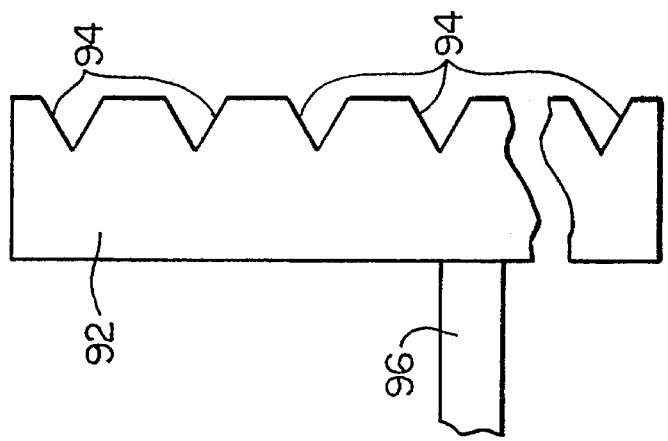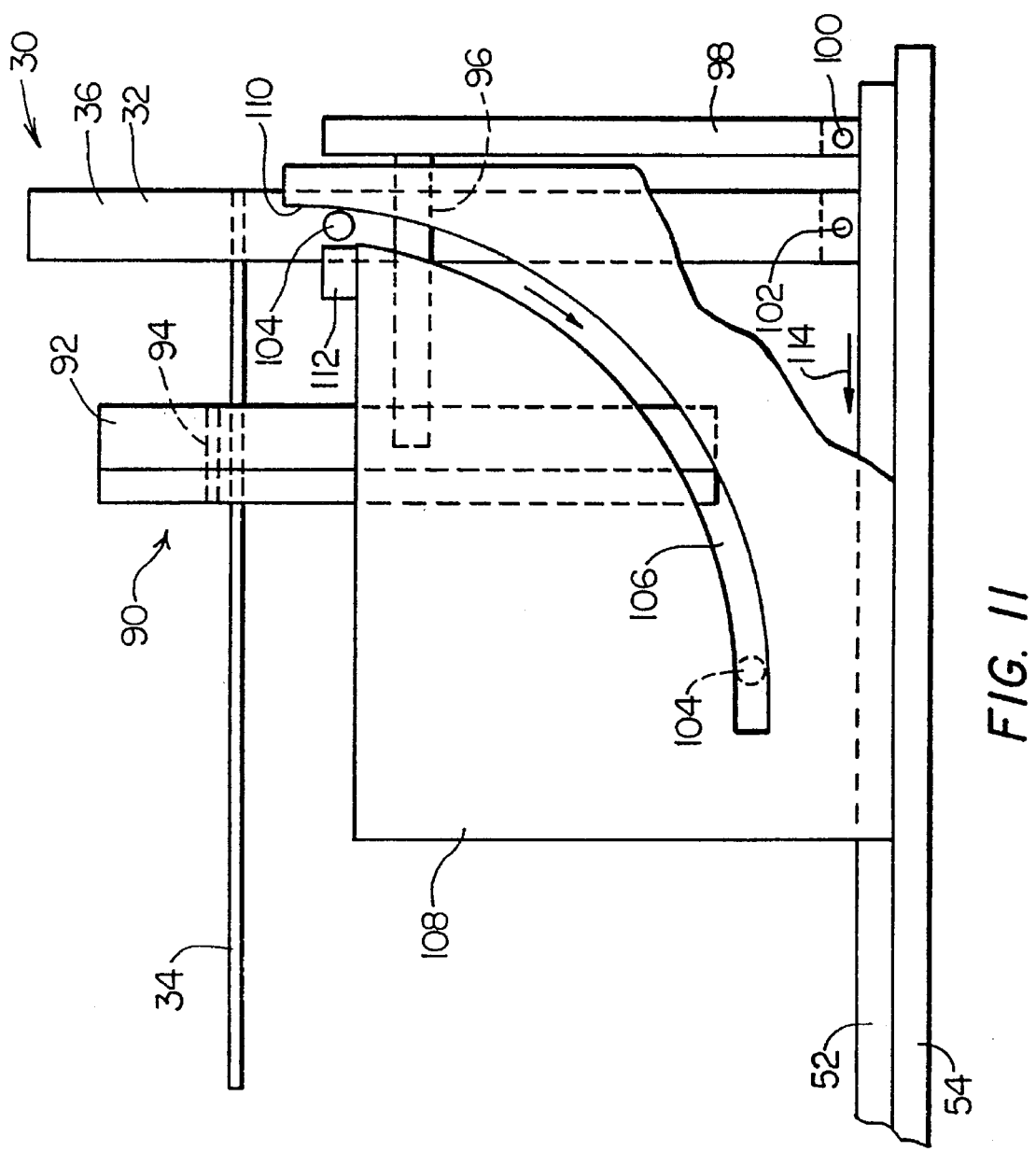

WAFER TRANSFER SYSTEM HAVING ROTATIONAL CAPABILITY

RELATED APPLICATION

This application claims the benefit of U.S. Provisional Application No. 60/000,963, filed Jul. 7, 1995.

This application is related to copending patent applications of the same inventors entitled Straight Line Wafer Transfer System and Wafer Transfer System Having Vertical Lifting Capability, filed concurrently herewith, the disclosures of which is incorporated by reference herein.

FIELD OF THE INVENTION

This invention relates to article handling apparatus and more particularly to semiconductor wafer handling apparatus.

BACKGROUND OF THE INVENTION

In the fabrication of semiconductor wafers, a plurality of wafers is usually disposed in a stacked, spaced apart relationship within a sealed carrier or pod having a door openable on one face of the carrier. The carrier when sealed provides a substantially contaminant-free environment for the wafers disposed therein, and these wafers can be moved within the carrier to various intended positions for processing into semiconductor devices or circuits. Often the wafers are stored in a cassette which is itself retainable in the carrier. The cassette is removable from the carrier for transferring the wafers from the carrier to the processing equipment. The carrier and cassette can maintain the wafers either horizontally or vertically.

In cassette-based systems, when the carrier is installed in position on processing apparatus, the carrier door is opened and the cassette within the carrier is removed from the carrier by a robot arm or other suitable transfer mechanism to a position at which one or more wafers can be removed from the cassette for conveyance to intended positions for subsequent processing. This motion typically involves a translation of the cassette out of the carrier along a straight line, either vertically or horizontally, and then a rotation of the cassette to a position in which the wafers are accessible to the processing apparatus. In similar fashion, wafers can be loaded into respective slots of the cassette and the cassette when fully loaded can be moved into the carrier by a rotation followed by a translation. The rotation of the wafers occurs over a separate area of the floor space than the translation of the wafers, thereby increasing the overall footprint of the device.

Recently, the semiconductor industry has begun manufacturing larger wafers having a diameter of 300 mm. Additionally, cassetteless carriers for these larger wafers are being introduced. These carriers hold the wafers horizontally on shoulders formed on the interior surfaces of the carrier. The same motion pattern of a translation followed by a rotation is typically used in the removal of the wafers from the cassetteless carrier.

In some processing applications, wafers are dipped in one or more baths for various purposes, during which the wafers must be held vertically. Typically, to orient horizontal wafers to a vertical position, the wafers are held in a cassette in which the back is open, allowing the wafers to protrude slightly. The cassette is tilted from horizontal to vertical and placed on its back on a flat surface, thereby pushing the protruding wafers upwardly to extend out of the cassette a sufficient distance for a robot arm or other transfer mechanism to grip the wafers. The robot arm then moves the vertically oriented wafers to the various baths. This method of orienting horizontal wafers to a vertical position, however, is not suitable for wafers held in cassetteless carriers.

SUMMARY OF THE INVENTION

The present invention provides a wafer transfer system in which one or more wafers stored horizontally in a cassetteless carrier can be rotated from horizontal to vertical for access by a robot arm for a particular process. The transfer system accomplishes the rotation in a minimal space and, in one embodiment, without increasing the footprint of the transfer system beyond that needed to remove the wafers from the carrier.

More particularly, the wafers are retained horizontally in a spaced, stacked array on shoulders of a front or side loading carrier. The wafers need not be stored in a separate cassette in the carrier, although a cassette may be employed if desired. The carrier has an opening on the front or side which is typically sealed by a removable door to provide access to the wafers stored therein.

The transfer system provides an extractor having at least one pair of horizontally extending fingers cantilevered from a support frame. Typically, a plurality of vertically spaced pairs of fingers are provided in a size and configuration to fit beneath and between the spaced, stacked wafers in the carrier. The extractor is horizontally translatable to insert the fingers beneath associated wafers within the carrier. The extractor is also movable with a small vertical component to bring the fingers into contact with the bottom surface of the wafers to lift the wafers off the shoulders of the carrier. The extractor is then horizontally translatable out of the carrier to remove the wafers therefrom.

The extractor and combs are rotated to a vertical orientation in which the wafers are supported along their edges by the combs. The extractor is shifted horizontally a small amount relative to the combs to disengage the fingers from the wafers, leaving the wafers in a position from which they can be accessed by a robot arm according to the particular process. In one embodiment, the extractor and combs are rotated about the same axis to the vertical orientation, and the extractor is then independently translated horizontally to disengage the fingers. In another embodiment, the extractor and combs are rotated about different axes, thereby traversing different arcs during the pivoting motion. The different arcs cause the fingers to disengage from the wafers as the extractor rotates, leaving the fingers supported by the combs.

In a still further embodiment, the extractor and fingers are coupled for horizontal translation on a base. As the extractor is rotated to vertical, a cam follower engages a track, thereby causing the extractor and comb to translate toward the carrier as they pivot. In this manner, the rotational mechanism does not increase the footprint of the transfer system.

DESCRIPTION OF THE DRAWINGS

The invention will be more fully understood from the following detailed description taken in conjunction with the accompanying drawings in which:

FIG. 11 is a side view of a still further embodiment of the transfer system of FIG. 6 employing a horizontal translation mechanism operable during rotation; and FIG. 12 is a broken away side view of a portion of the comb structure of the present invention taken along line XII—XII of FIG. 7.

DETAILED DESCRIPTION OF THE INVENTION

Figure 1:
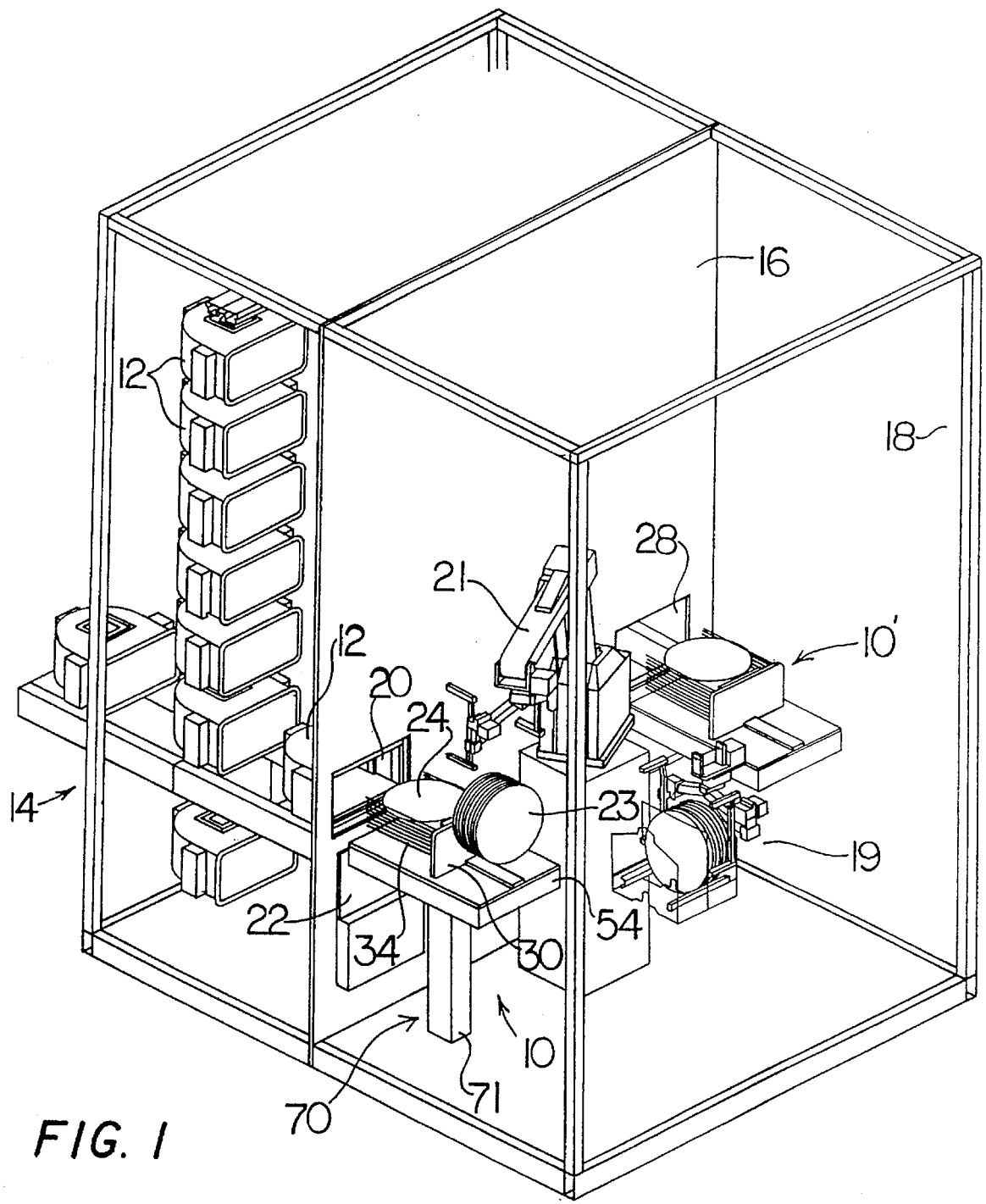
FIG. 1 is a perspective view of a portion of a wafer transfer system according to the present invention employing a vertical elevator.

A transfer system 10 according to the present invention is shown generally in FIG. 1. In the configuration shown, a plurality of carriers 12 are held in a storage device 14 on the opposite side of a wall 16 of a contaminant-free environment 18 containing processing equipment 19, including a robot arm 21. The carrier 12 to be accessed is positioned adjacent and sealed against an opening 20 in the wall 16. A door 22 sealing the opening is removable to reveal semiconductor wafers 24 stacked horizontally on paired, opposed shoulders 26 inside the carrier 12 (shown in FIGS. 4 and 5), as is known in the art. A transfer system 10 according to the present invention is positioned adjacent the opening 20 in the contaminant-free environment for transferring wafers from the carrier to the processing equipment, first along a straight line out of the carrier and then by rotating the wafers to a vertical orientation, indicated at 23. For clarity, only a portion of the transfer system 10 is shown in FIG. 1; the rotational mechanism is shown and discussed in greater detail below. In the configuration shown in FIG. 1, a second opening 28 is also provided for access to a carrier; a transfer system 10' may be positioned adjacent this opening also. Additionally, although illustrated in conjunction with a carrier storage device, the transfer system is operable with any type of wafer handling apparatus.

Referring more particularly to FIGS. 2 through 5, the transfer system comprises a wafer extractor 30 having a support structure 32 from which are cantilevered one or more pairs of fingers 34 for supporting the wafers 24. For clarity, the rotational mechanism is not shown in FIGS. 2 through 5. The extractor support structure may comprise, for example, a frame formed by two columns 36 supported by a lower beam 38 and connected together at their upper ends by an upper beam 40 in a box configuration. The upstanding columns are spaced apart horizontally a distance sufficient to provide clearance for a comb structure 90 to fit therebetween as discussed further below. The support structure 32 is mounted for horizontal translation and for movement having a small vertical component within the carrier, also discussed further below in conjunction with FIGS. 6 through 11. The support structure can be configured in any other suitable manner to support the wafers and to provide clearance for the comb structure.

Figure 2:
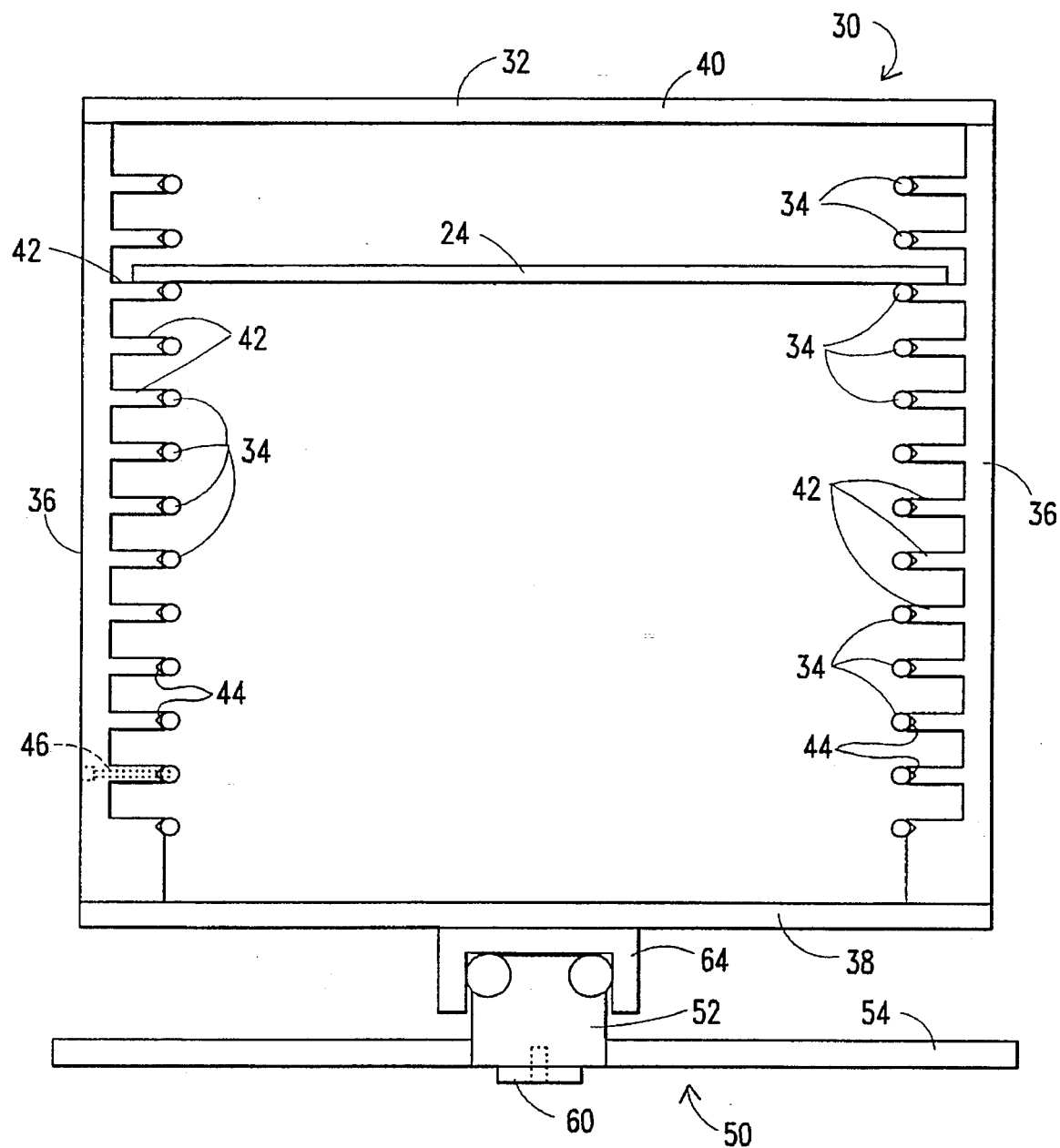
FIG. 2 is a front view of a further embodiment of a portion of the wafer transfer system of the present invention employing a tilting mechanism.
Figure 3:
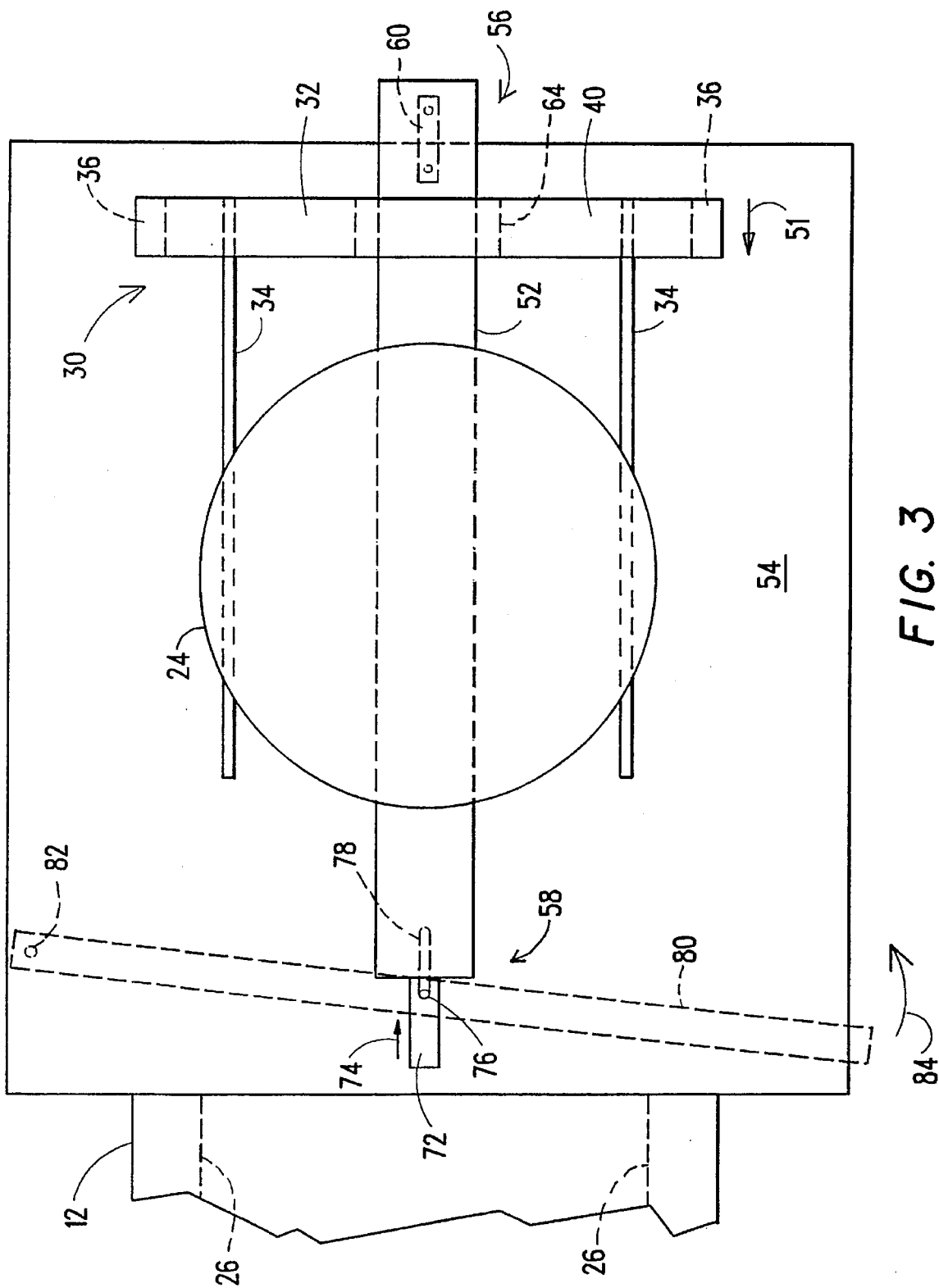
FIG. 3 is a top view of the wafer transfer system of FIG. 2.

The transfer system 10 is partially shown more particularly in FIGS. 2 through 5. The fingers 34 of the extractor 30 are arranged in pairs stacked vertically along the two columns 36. Each pair lies in a generally horizontal plane with one finger 34 of each pair cantilevered from an associated column 36. As best seen in FIGS. 2 and 3, each finger 34 is inwardly offset from its associated column 36 and extends generally horizontally from the support structure 32 toward the carrier 12. To offset the fingers, each finger is supported by a tab 42 which is configured so as not to interfere with the wafers 24. For example, in the embodiment shown, each finger 34 is a rod having a circular cross-section. The tabs 42 are a plurality of inwardly extending members integrally formed with the columns 36 and whose upper surface is no higher than the upper surface of the finger 34. A notch 44 is formed in the end of each tab into which a portion of an associated rod is placed. The rods are retained in the notch by a screw 46, only one of which is indicated in FIG. 2 for clarity. Other ways of mounting the fingers to the columns may be used. For example, the tabs can be integrally formed with the fingers such as by bending the fingers near one end to form a short leg which may be fastened to the columns in any appropriate manner.

Figure 5:
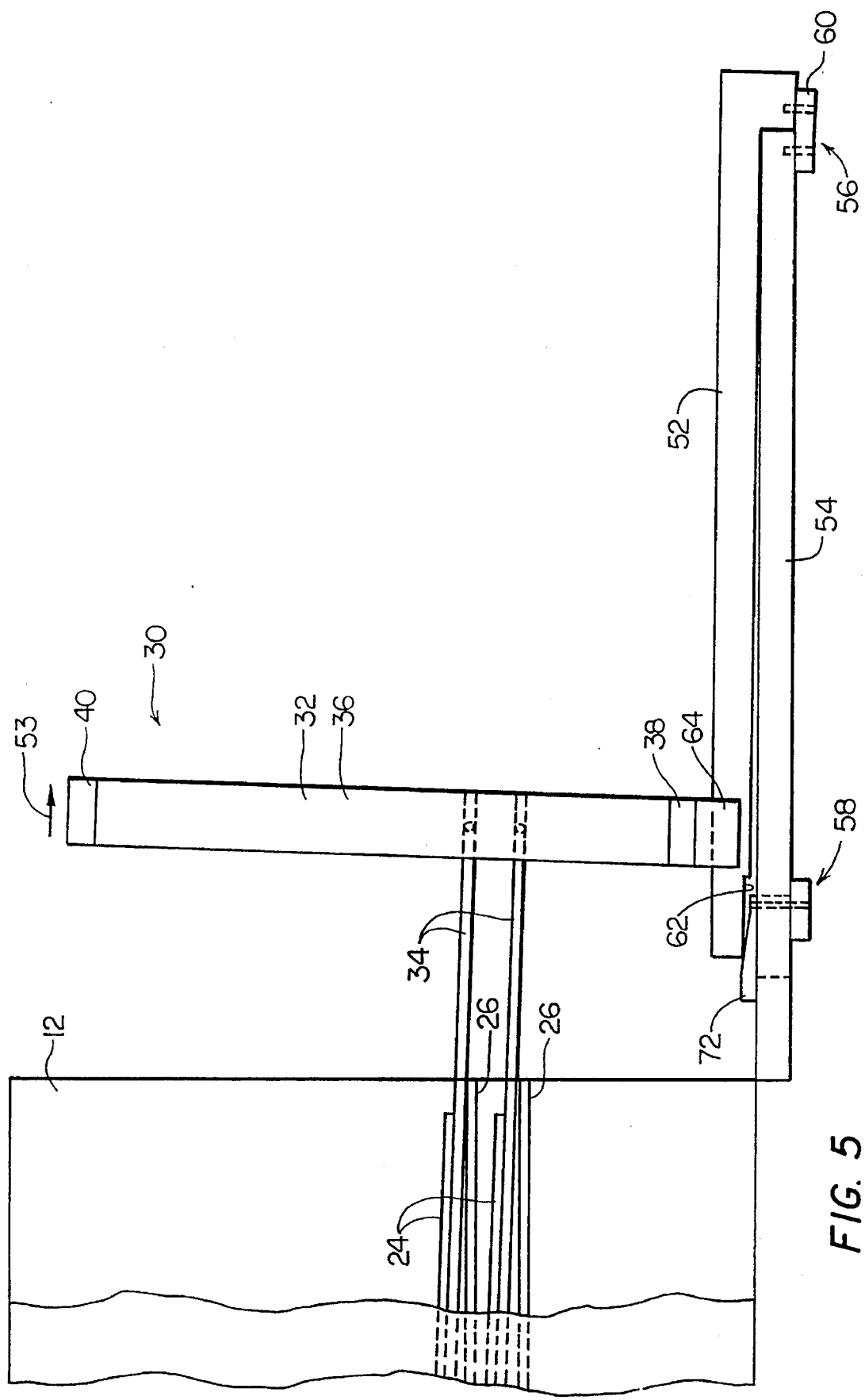
FIG. 5 is a side view of the wafer transfer system of FIG. 2 in a position within a wafer carrier.

The pairs of fingers 34 are spaced apart vertically along the columns 36 with a pitch or spacing between corresponding points approximately equal to the vertical pitch of the wafers 24 in the carrier 12, as best seen in FIG. 5. This spacing allows the fingers 34 to be inserted beneath and between associated wafers 24 stacked in the carrier 12. Referring to FIG. 3, the fingers 34 of each pair are horizontally spaced apart from each other a distance which allows them to support the wafers 24 slightly inwardly of the wafers' edges and of the shoulders 26 in the carrier 12 to thereby lift the wafers 24 off of the shoulders 26. The pairs of fingers are typically provided in a number equal to the number of wafers storable in the carrier, generally thirteen or twenty-five for cassetteless carriers. An extractor having thirteen pairs of fingers can also be used to extract wafers from a carrier holding twenty-five wafers by making two passes. However, any desired number of pairs of fingers can be provided.

The extractor 30 is reciprocally movable, indicated by arrows 51, 53, by a horizontal transport mechanism 50 in a generally horizontal plane to insert the fingers 34 into the open carrier 12, with each pair of fingers fitting beneath an associated wafer 24. The extractor is also movable with a small vertical component by a lifting mechanism 70 to bring each finger 34 into contact with the bottom surface of its associated wafer 24 to lift each wafer off the shoulders 26 in the carrier 12. Once the wafers have been lifted up, the extractor 30 is moved horizontally back out of the carrier 12 by the transport mechanism 50, thereby moving the wafers out of the carrier 12.

The horizontal transport mechanism 50 may comprise a track 52 mounted to a fixed base plate 54 and extending from a distal location 56 to a location 58 proximal the opening of the carrier. The track is hinged to the base plate at the distal location 56 in any suitable manner for a purpose to be discussed below. For example, a flexible strap 60 can be fastened to the underneath of the track and the base plate. A cut out 62 is formed at the opposite end of the track 52 at the proximal location 58, also for a purpose to be discussed below. The extractor 30 is mounted for reciprocal motion along the track, illustrated schematically by a U-shaped guideway 64 fastened to the underside of the lower beam 38 of the support frame 32 for maintaining the extractor on the track. Any suitable actuator, as would be known in the art, may be used to move the extractor along the track. It will be appreciated, however, that any suitable mechanism for providing horizontal reciprocal motion of the extractor can be used in the present invention. For example, a linkage or robot arm configured to provide straight-line motion can be used to drive the extractor. The horizontal transport mechanism can be controlled in any suitable manner, such as by a microprocessor-based controller, as would be known in the art.

The lifting mechanism 70 provides the extractor with a small vertical component of motion. The lifting mechanism can comprise a vertical elevator 71 disposed below the base plate 54, shown schematically in FIG. 1. Any suitable elevator mechanism, as would be known in the art, may be used. The vertical motion component could also be supplied by moving the carrier vertically by an elevator, rather than by moving the extractor. Any suitable controller can be provided to control the lifting mechanism.

Figure 4:
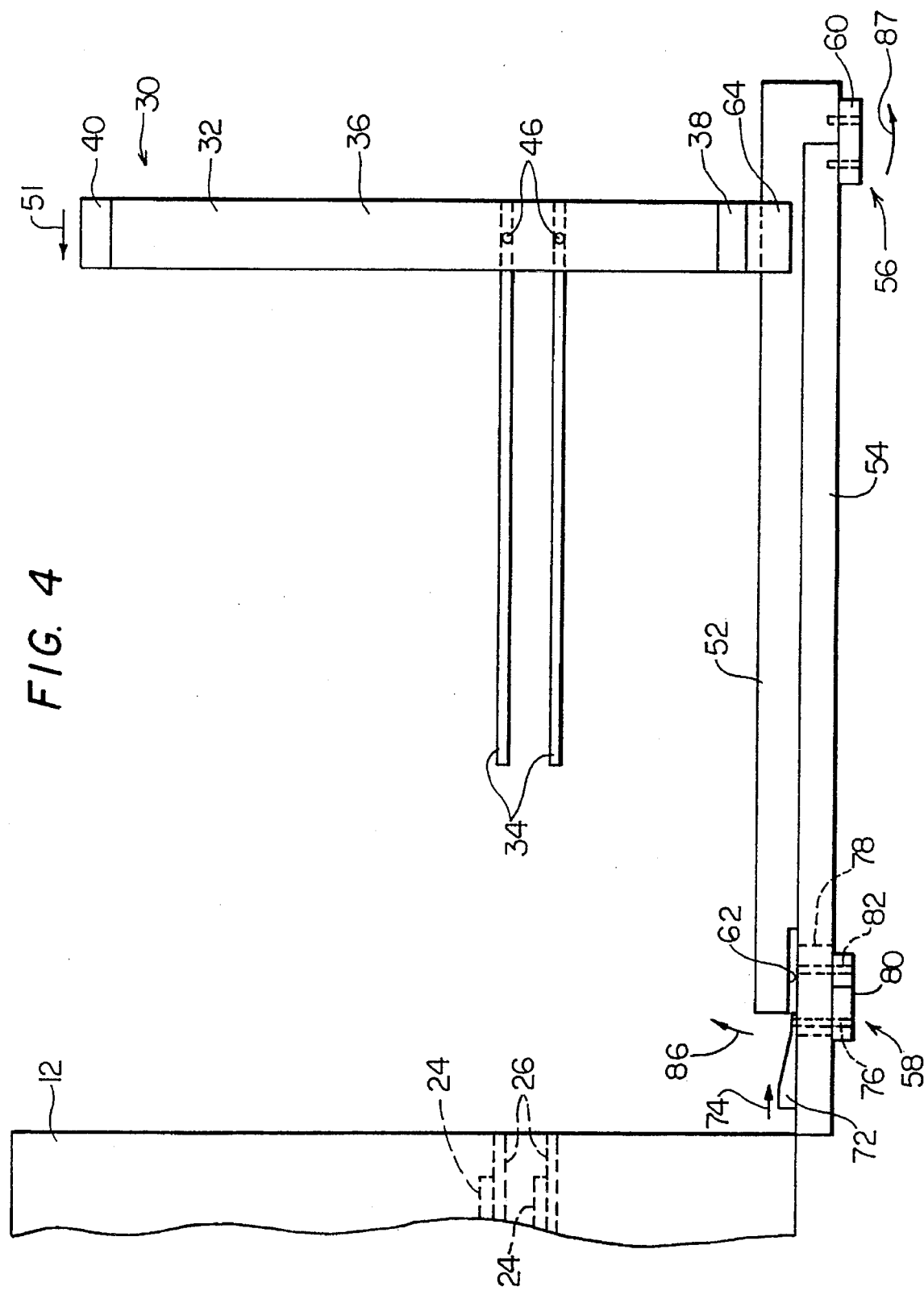
FIG. 4 is a side view of the wafer transfer system of FIG. 2 in a wafer accessible position.

Alternatively, referring to FIGS. 3 through 5, the lifting mechanism 70 can supply the vertical component of motion by tilting the fingers 34 through a small angle into contact with an undersurface of the associated wafers 24 sufficiently to lift the wafers off the support shoulders in the carrier 12. For example, a wedge 72 may be provided at the end of the track 52. By virtue of the cut out 62 in the track, the wedge is movable to a position underneath the track, indicated by the arrow 74, thereby tilting the track upwardly slightly about the hinge 60 at the distal location 56. The wedge 72 can be moved in any suitable manner, as by a pin 76 extending through a slot 78 in the base plate 54. The pin 76 is fastened to an arm 80 which may be pivoted, as by a suitable motorized mechanism, about a further pin 82 fixed to the base plate 54, whereby pivoting of the arm 80 causes movement of the wedge 72, as indicated by the arrows 84, 74. The wedge 72 tilts the track 52, which in turn causes the extractor 30 to tilt, as indicated by arrows 86, 87. The tilting of the extractor 30 lifts the wafers 24 off the shoulders 26 in the carrier 12 on the fingers 34. Due to the relatively long distance between the wedge 72 at the proximal location 58 and the hinge 60 at the distal location 56, only a small vertical component of motion results. After the wafers 24 have been lifted off the shoulders 26, the extractor 30 is moved generally horizontally back along the track 52 to withdraw the wafers from the carrier. It will be appreciated that the entire extractor follows a slightly angled path if the extractor is tilted to lift the wafers off the shoulders; however, the angle is so small that the path can be considered to be generally horizontal.

Figure 6:
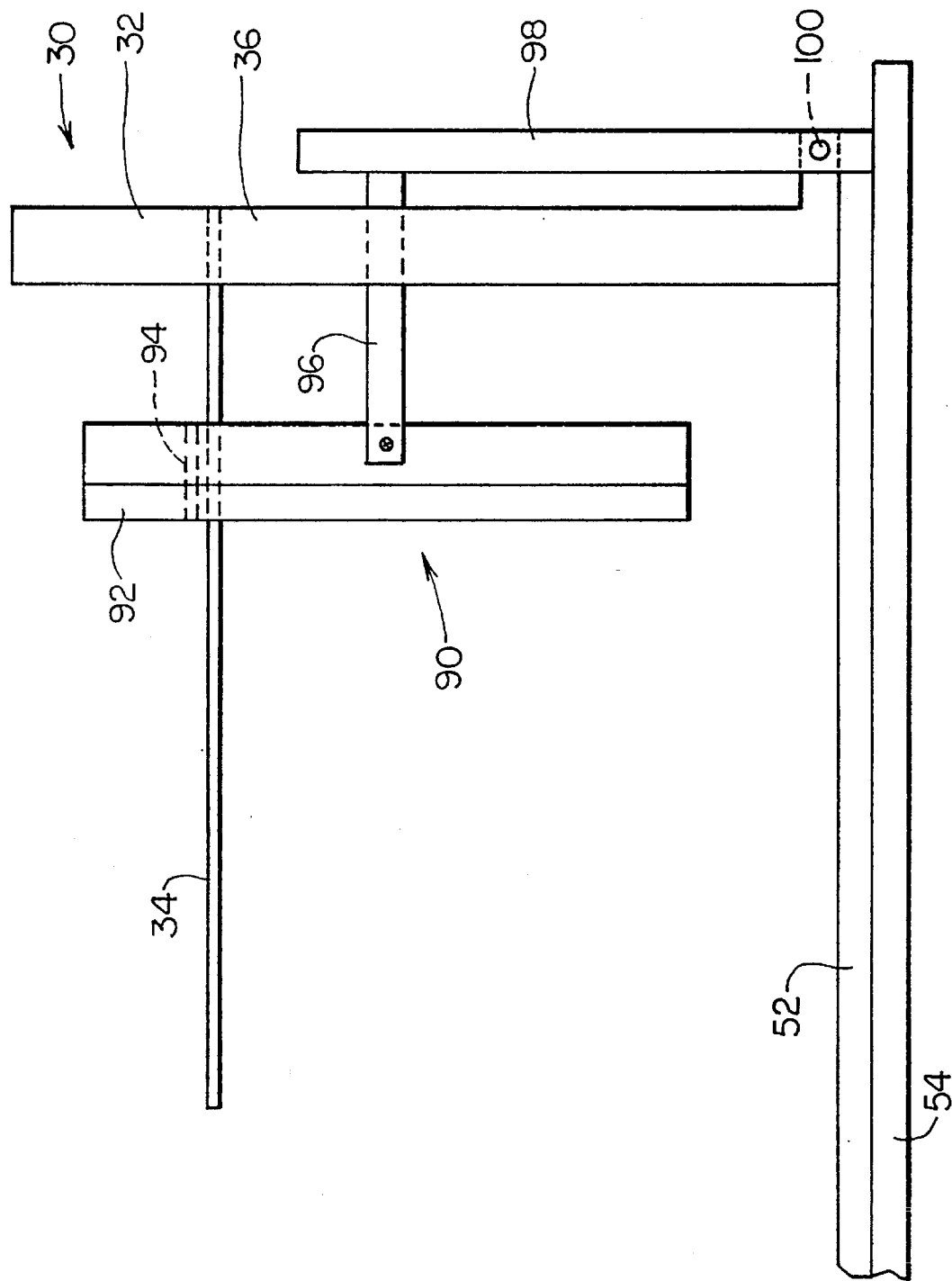
FIG. 6 is a side view of the wafer transfer system of FIGS. 1 or 2 illustrating the comb structure.
Figure 7:
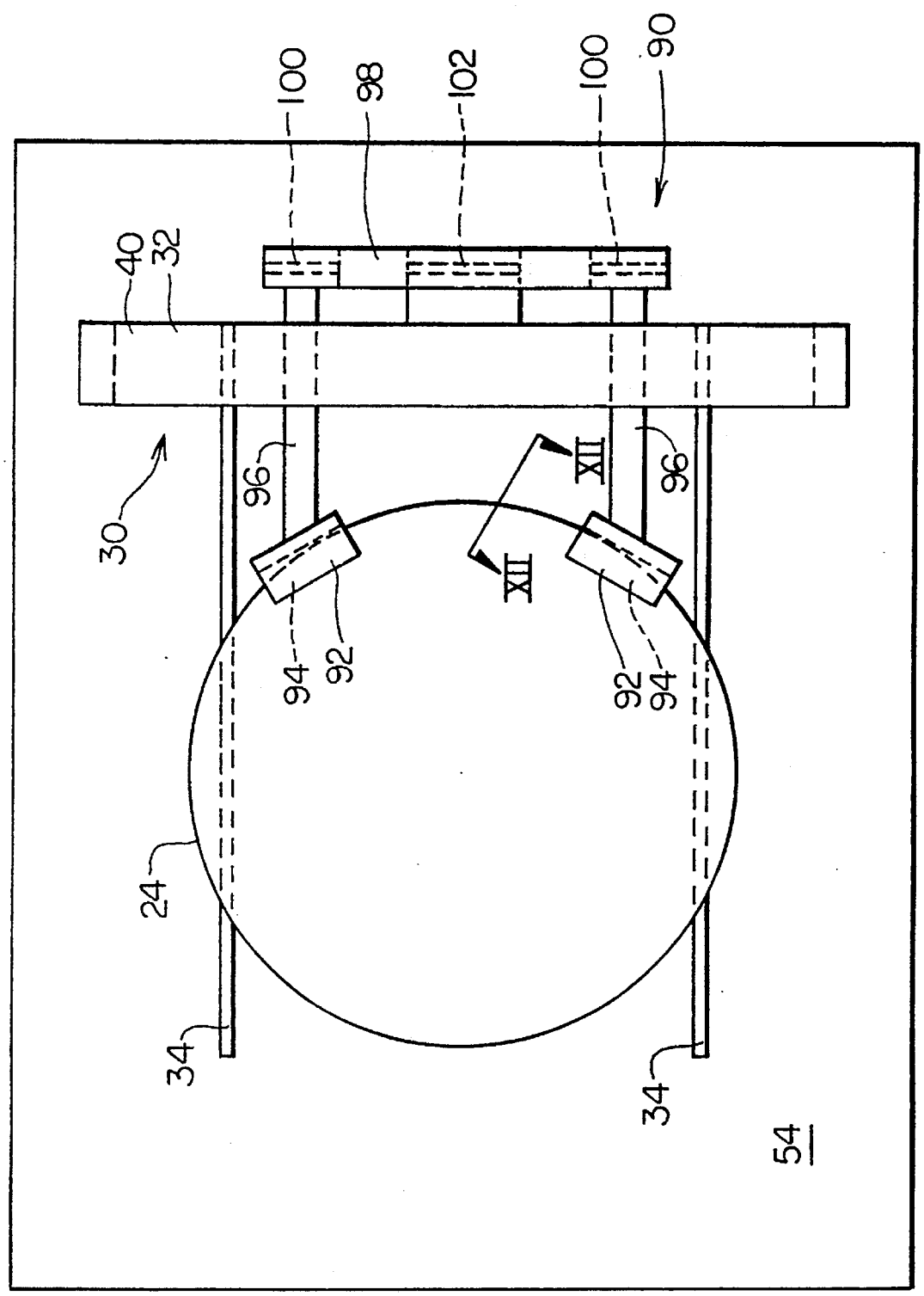
FIG. 7 is a top view of the wafer transfer system of FIG. 6.

Once the wafers 24 have been extracted from the carrier 12, they are rotated to a vertical orientation to be accessible to processing equipment, such as by the robot arm 21 illustrated in FIG. 1. In particular, referring to FIGS. 6, 7, and 12, the extractor 30 pulls the wafers 24 out of the carrier until the edges of the wafers contact a comb structure 90. The comb structure comprises two combs 92 vertically disposed in FIGS. 6 and 7 to receive the horizontal wafers. The combs have a plurality of wedge- or triangular-shaped cut outs 94. The pitch of the cut outs is the same as that of the fingers 34. Each cut out 94 is associated with a respective finger so that the upper surface of each finger is at the bottom of the cut out, as best seen in FIG. 6. In this manner, the edge of a wafer 24 supported by the finger 34 can be placed into the cut out 94, as best seen in FIG. 7. It will be appreciated that the shape of the cut outs can be other than wedge shaped, such as square or rounded.

Each comb 92 is supported at an angle, best indicated in FIG. 7, by an arm 96 extending from a comb structure frame 98 which is pivotally mounted to the base in any suitable manner, such as by a hinge 100. The angled orientation of the two combs 92 ensures that, when the comb structure 90 is rotated to a vertical orientation, the two combs 92 are able to support each wafer in the cut outs 94 at approximately the 5 o'clock and the 7 o'clock positions.

Figure 8:
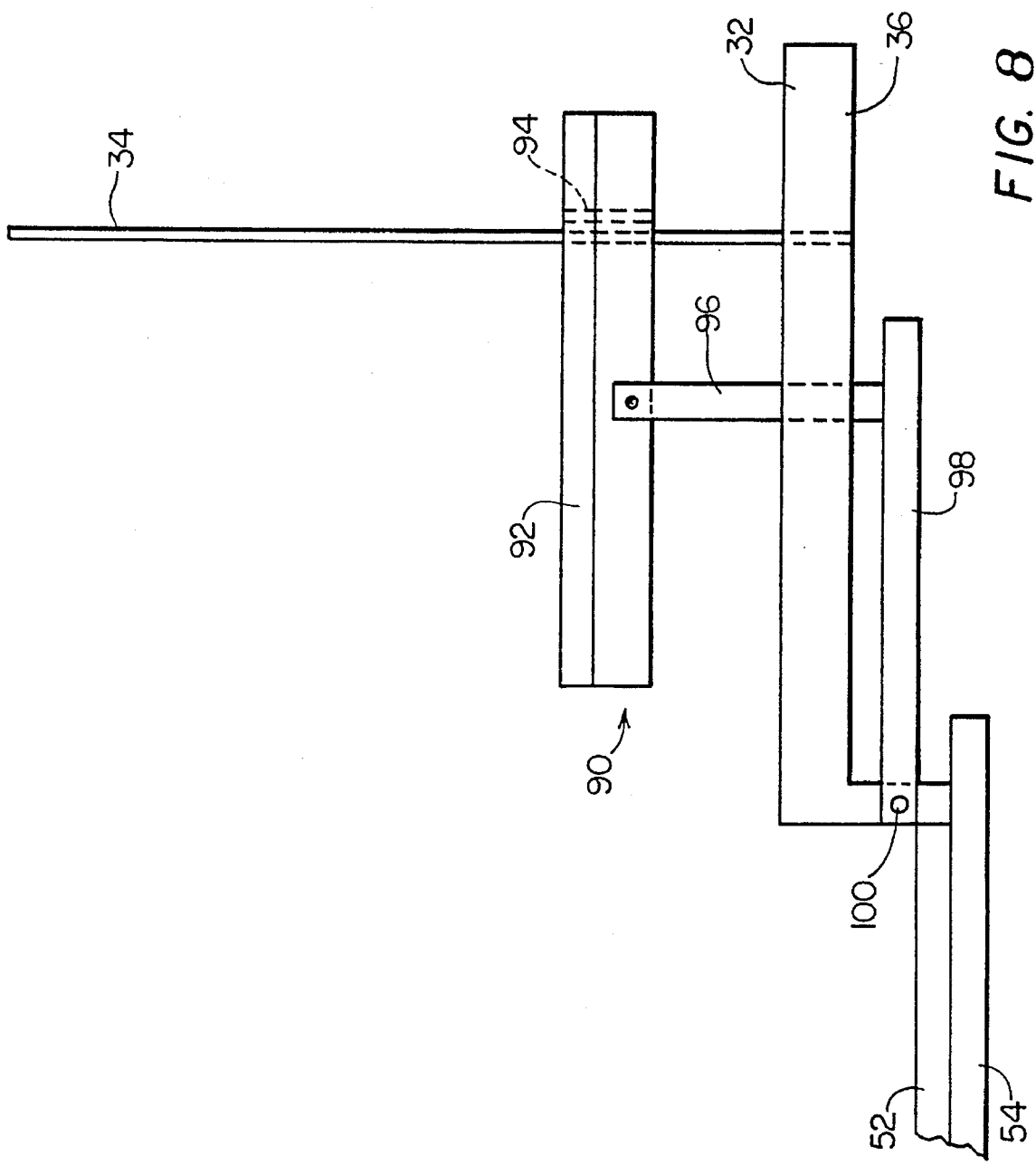
FIG. 8 is a side view of the wafer transfer system of FIG. 6 rotated to a vertical orientation.

The extractor support frame 32 is also pivotally mounted to the base 54 in any suitable manner, for example, by a hinge 102. In one embodiment, shown in FIGS. 6 through 9, the pivot axes of the extractor frame 32 and the comb structure frame 98 are aligned. The extractor frame 32 and the comb structure frame 98 are rotated to a vertical orientation, as indicated in FIG. 8. The rotation can be performed by any suitable rotatable mechanism and may be controlled by any suitable controller, as would be known in the art. After the rotation is completed, the extractor frame 32 is shifted horizontally a small amount, as indicated by the arrow 104 in FIG. 9. This shift separates the fingers 34 of the extractor 30 from the wafers 24, thereby freeing the wafers for gripping and lifting by the robot arm 21, as indicated in FIG. 1. The horizontal shift can be controlled by the horizontal translation mechanism 50 discussed above or in any other suitable manner.

Figure 9:
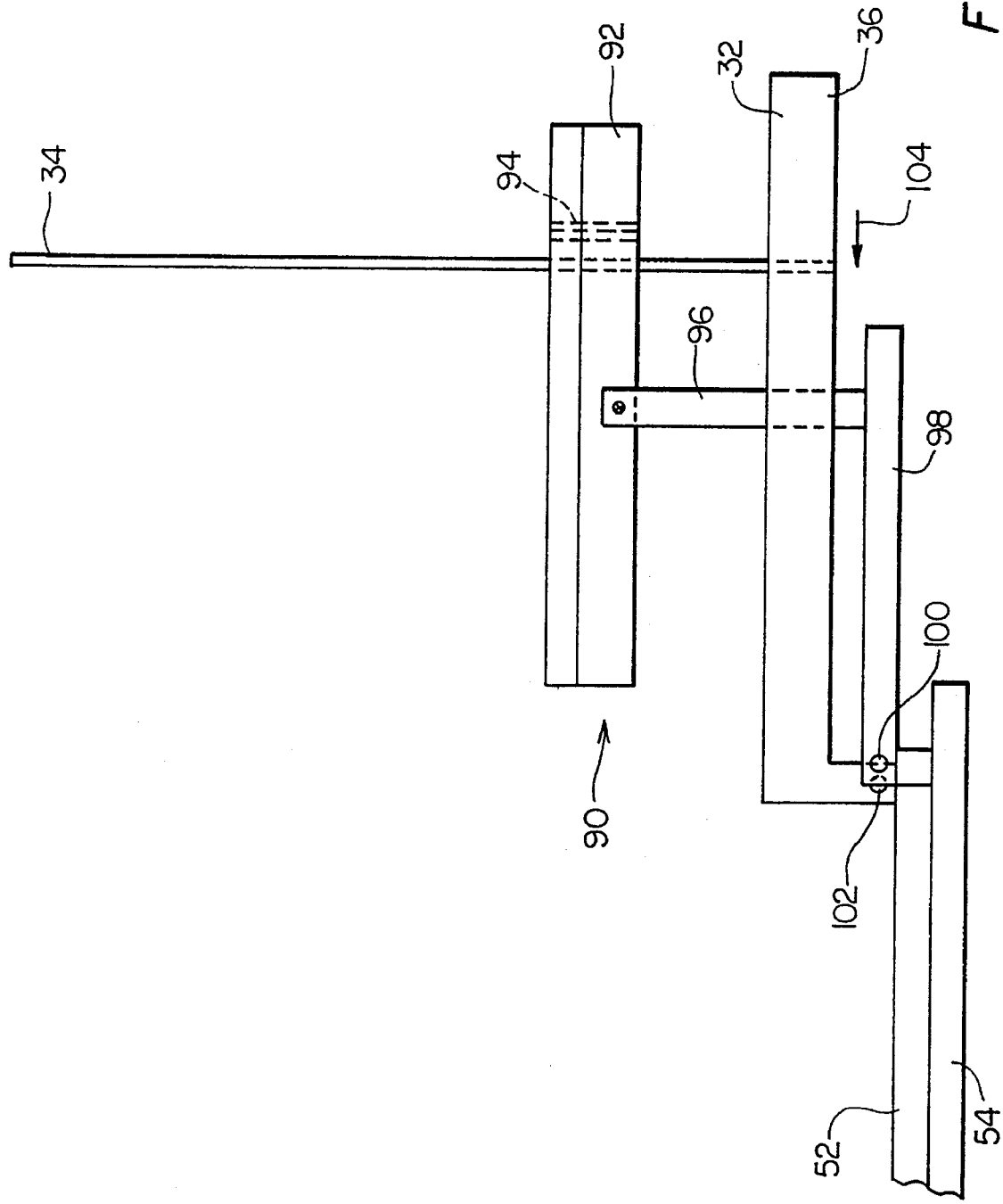
FIG. 9 is a side view of the wafer transfer system of FIG. 8 in which the extractor is horizontally shifted.
Figure 10:
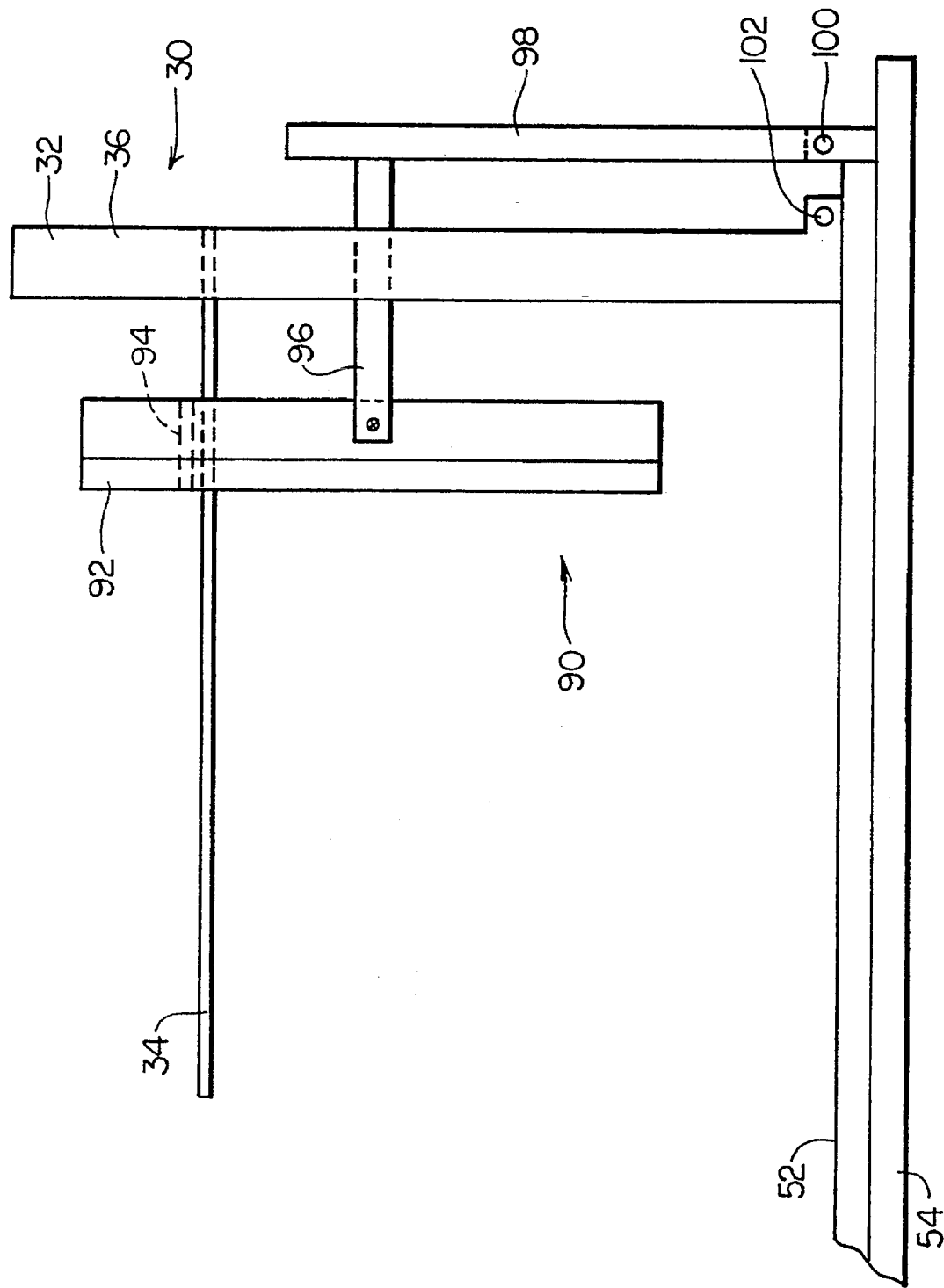
FIG. 10 is a side view of a further embodiment of the transfer system of FIG. 6 employing two different pivot axes.

FIG. 10 illustrates a further embodiment for rotating the extractor 30 and comb structure 90. In this embodiment, the extractor frame 32 and comb structure frame 98 are mounted for rotation about different pivoting axes. During rotation, the extractor 30 and the coma structure 90 traverse different arcs such that the extractor fingers 34 shift away from the wafers 24 during the rotation. When the wafers reach the vertical position, they are freed from the extractor fingers 34 for access by the robot arm 21 of the processing equipment, as shown in FIG. 9.

A still further embodiment is illustrated in FIG. 11. In this embodiment, the extractor 30 and the comb structure 90 are coupled and caused to translate toward the carrier 12 at the same time that they are rotated to the vertical position. In this manner, the rotation to vertical does not require increasing the footprint of the device beyond that used for horizontally translating the extractor.

More specifically, one, or both, of the columns 36 of the extractor frame 32 includes a cam follower 104 extending outwardly to the side. A curved track 106 is provided along the side of the extractor frame, for example, by forming a slot in a wall element 108. The curved track 106 includes a back stop 110 such that the extractor 30 is horizontally translated from the carrier 12 until the cam follower 104 abuts against the back stop 110. The back stop may, for example, comprise an extended portion of the curved track 106. A retractable forward stop 112 is placed in front of the cam follower 104 to prevent further horizontal translation back along the path just taken by the cam follower. The forward stop can be formed in any suitable manner as by an element movably mounted to the wall element 108. In operation, with the forward stop 112 upraised, as the extractor 30 and coupled comb structure 90 are rotated to the vertical position, the cam follower 104 engages the curved track 106 which forces the extractor 30 and comb structure 90 to translate forward in the direction of arrow 114 at the same time.

To reload the carrier 12, the processing equipment returns the wafers 24 in a vertical orientation to the comb structure 90. The comb structure 90 and extractor 30 rotate the wafers to a horizontal orientation in which the wafers are supported on the fingers 34. The extractor 30 is moved horizontally along the straight line path until the fingers 34 and wafers 24 have been inserted into the carrier. The extractor 30 is moved with a small vertical component to lower the wafers 24 onto the shoulders 26 of the carrier 12 and horizontally translated to remove the unloaded fingers 34 from the carrier 12.

The transfer mechanism of the present invention makes possible higher machine throughput and has improved positioning accuracy over plastic cassettes. In one embodiment, the present invention provides a transfer system having a smaller footprint than present systems. Moreover, the present invention requires no additional cassette transfer or orientation mechanism as in present systems. Additionally, the carrier design can be smaller.

The invention is compatible with high temperature wafers and is operable in both vacuum and atmospheric processes. For atmospheric processes, the transfer system is preferably made from aluminum or plastic materials. For vacuum processes, the materials are preferably ceramics and stainless steels, which do not outgas. Although designed primarily for use with cassetteless carriers, the transfer system of the present invention can be implemented with cassette-based systems if desired. Additionally, the transfer system can be used to remove one or any number of wafers.

The invention is not to be limited by what has been particularly shown and described, except as indicated by the appended claims.

We claim:

1. A semiconductor wafer transfer system for moving a wafer horizontally into and out of a wafer support device to and from a position in which the wafer is maintained in a vertical orientation accessible for further processing, the wafer support device having opposed, paired shoulders on interior walls thereof to support the wafer in a horizontal orientation, the support device further having a vertical opening therein, the wafer transfer system comprising:

a base positioned adjacent the opening in the wafer support device;

an extraction structure mounted to the base for generally horizontal reciprocal movement into and out of the wafer support device for removing the wafer from the wafer support device along a generally horizontal path, the extraction structure further mounted to the base for rotation to a generally vertical orientation; and a wafer support structure comprising wafer receiving elements disposed to receive the wafer from the extraction structure, the wafer support structure mounted to the base for rotation to a generally vertical orientation concurrently with the extraction structure.

2. The wafer transfer system of claim 1, wherein the wafer receiving elements each include a recess configured to receive an edge portion of the wafer.

3. The wafer transfer system of claim 1, wherein the wafer receiving elements each include a plurality of recesses configured to receive an edge portion of an associated wafer.

4. The wafer transfer system of claim 1, wherein the wafer support structure comprises two wafer receiving elements disposed at an angle with respect to each other to receive differing portions of the wafer.

5. The wafer transfer system of claim 1, wherein the extraction structure comprises a frame having an opening therethrough and the wafer support structure comprises a pair of arms extending through the opening, the wafer receiving elements being mounted to the arms to receive the wafer in a horizontal orientation from the extraction structure.

6. The wafer transfer system of claim 1, wherein the extraction structure and the wafer support structure are mounted for rotation about a single axis.

7. The wafer transfer system of claim 6, wherein the extraction structure is mounted for a horizontal shift when in the vertical orientation away from the wafer support structure to free a wafer from the extraction structure, leaving the wafer in the vertical orientation supported solely by the wafer support structure.

8. The wafer transfer system of claim 1, wherein the extraction structure and the wafer support structure are mounted for rotation about differing axes, whereby the extraction structure and the wafer support structure traverse differing arcs during rotation to the vertical orientation, whereby the wafer is freed from the extraction structure during rotation to the vertical orientation, leaving the wafer in the vertical orientation supported solely by the wafer support structure.

9. The wafer transfer system of claim 1, wherein the extraction structure and the wafer support structure are mounted for horizontal translation toward the wafer support device during rotation to the vertical orientation.

10. The wafer transfer system of claim 9, further comprising a curved track and wherein the extraction device includes a cam follower disposed to traverse the curved track during rotation to the vertical orientation.

11. The wafer transfer system of claim 1, wherein the extraction structure comprises a pair of fingers, each finger mounted to one of a pair of upstanding members to extend outwardly in a generally horizontal plane toward the opening in the support device, the fingers being spaced apart a distance to fit beneath the wafer in the wafer support device at a location inwardly of the shoulders.

12. The wafer transfer system of claim 11, further comprising a lifting mechanism for providing a component of relative vertical motion between the extraction structure and the wafer support device to bring the fingers into and out of contact with the undersurface of the wafer for lifting the wafer off and loading the wafer onto the shoulders of the support device.

13. The wafer transfer system of claim 1, wherein the extraction structure comprises a plurality of pairs of fingers, each finger of each pair mounted to one of a pair of upstanding members to extend outwardly in a generally horizontal plane toward the opening in the support device, the fingers of each pair being spaced apart a distance to fit beneath the wafer in the wafer support device inwardly of the shoulders, the pairs being vertically spaced apart a distance to fit between a plurality of wafers in the wafer support device.

14. The wafer transfer system of claim 1, further comprising a track mounted to the base, the extraction structure being mounted for reciprocal motion along the track.

15. A semiconductor wafer transfer system for moving a wafer horizontally into and out of a wafer support device to and from a position in which the wafer is maintained in a vertical orientation accessible for further processing, the wafer support device having opposed, paired shoulders on interior walls thereof to support the wafer in a horizontal orientation, the support device further having a vertical opening therein, the wafer transfer system comprising:

means for translating the wafer generally horizontally into and out of the wafer support device;

means for receiving the wafer from the translating means and for supporting the wafer in a vertical orientation; and means for rotating the receiving means and the translating means concurrently to rotate the wafer to and from a generally vertical position in which the wafer is accessible to further processing equipment.

16. The wafer transport system of claim 15, wherein the receiving means comprise a wafer support structure comprising wafer receiving elements disposed to receive the wafer from the translating means, the wafer receiving elements each having a recess configured to receive an edge portion of the wafer.

17. The wafer transfer system of claim 16, wherein the wafer receiving elements are disposed at an angle with respect to each other to receive differing portions of the wafer.

18. The wafer transfer system of claim 16, wherein the translating means and the receiving means are mounted for rotation about a single axis.

19. The wafer transfer system of claim 18, wherein the translating means is mounted for a horizontal shift when in the vertical orientation away from the receiving means to free a wafer from the extraction structure, leaving the wafer in the vertical orientation supported solely by the receiving means.

20. The wafer transfer system of claim 16, wherein the translating means and the receiving means are mounted for rotation about differing axes, whereby the translating means and the receiving means traverse differing arcs during rotation to the vertical orientation and the wafer is freed from the translating means during rotation to the vertical orientation, leaving the wafer in the vertical orientation supported solely by the receiving means.

21. The wafer transfer system of claim 16, wherein the translating means and the receiving means are mounted for horizontal translation toward the wafer support device during rotation to the vertical orientation.

22. A process for moving a wafer horizontally into and out of a wafer support device to and from a position in which the wafer is maintained in a vertical orientation accessible for further processing, the wafer support device having opposed, paired shoulders on interior walls thereof to horizontally support the wafer, the support device further having a vertical opening therein, the process comprising:

providing a wafer transfer device comprising:
a base positioned adjacent the opening in the wafer support device,
an extraction structure mounted to the base for generally horizontal reciprocal movement into and out of the wafer support device for removing the wafer from the wafer support device along a generally horizontal path, the extraction structure further mounted to the base for rotation to a generally vertical orientation, and
a wafer support structure comprising wafer receiving elements disposed to receive the wafer from the extraction structure, the wafer support structure mounted to the base for rotation to a generally vertical orientation concurrently with the extraction structure;

moving the wafer by the extraction structure along a generally horizontal path out of the support device into contact with the wafer support structure; and rotating the extraction structure and the wafer support structure concurrently to a generally vertical orientation.

23. The process of claim 22, wherein the rotating step comprises rotating the extraction structure and the wafer support structure about a single axis.

24. The process of claim 23, further comprising the step of shifting the extraction structure horizontally out of contact with the wafer, leaving the wafer supported by the wafer support structure.

25. The process of claim 22, wherein the rotating step comprises rotating the extraction structure and the wafer support structure about differing axes.

26. The process of claim 22, further comprising translating the extraction structure and the wafer support structure horizontally during the rotation step.

* * * * *